(12) United States Patent
Lau et al.

(10) Patent No.: US 6,313,185 B1
(45) Date of Patent: Nov. 6, 2001

(54) POLYMERS HAVING BACKBONES WITH REACTIVE GROUPS EMPLOYED IN CROSSLINKING AS PRECURSORS TO NANOPOROUS THIN FILM STRUCTURES

(75) Inventors: Kreisler Lau, Sunnyvale, CA (US); Tian-An Chen, Duluth, GA (US); Roger Leung, San Jose, CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/538,276

(22) Filed: Sep. 24, 1998

Related U.S. Application Data
(60) Provisional application No. 60/128,465, filed on Apr. 9, 1999.

(51) Int. Cl.$^7$ ....................................... C08J 9/02
(52) U.S. Cl. ........................... 521/77; 521/134; 521/138; 521/139; 521/181; 521/182; 521/184; 525/450; 525/534
(58) Field of Search .............................. 521/77, 134, 138, 521/139, 181, 182, 184; 525/450, 534

(56) References Cited

U.S. PATENT DOCUMENTS
4,661,558 * 4/1987 Bell et al. ............................... 525/36
5,965,679 * 10/1999 Godschalx et al. .................. 526/281

* cited by examiner

Primary Examiner—Morton Foelak
(74) Attorney, Agent, or Firm—Robert D. Fish; Fish & Associates, LLP

(57) ABSTRACT

Nanoporous materials are fabricated from polymers having backbones with reactive groups used in crosslinking. In one aspect of preferred methods and compositions, the reactive groups in the backbone comprise a diene and a dienophile. The diene may advantageously comprise a tetracyclone, and the dienophile may advantageously comprise an ethynyl. In another aspect of preferred methods and compositions, the reactive groups in the backbone are included in a conjugated system. Especially preferred polymeric strands comprise a poly(arylene ether) synthesized from a difluoroaromatic portion and an aromatic bisphenolic portion. It is still more preferred that the difluoroaromatic portions of the poly (arylene ether) are modified in such a way that some difluoroaromatic portions carry a thermolabile portion. In still other aspects crosslinking may advantageously occur without reliance on an exogenous crosslinker.

20 Claims, 11 Drawing Sheets ethylene glycol-poly(caprolactone)
$M_w$ 3000, domain size ~ 30 A

DEAD=diethyl azodicarboxylate reagent

POLYMERS HAVING BACKBONES WITH REACTIVE GROUPS EMPLOYED IN CROSSLINKING AS PRECURSORS TO NANOPOROUS THIN FILM STRUCTURES

This application claims the benefit of U.S. provisional application number 60/128,465 filed Apr. 9, 1999, incorporated herein by reference in its entirety.

FIELD OF THE INVENTION

The field of the invention is nanoporous materials.

BACKGROUND

As the size of functional elements in integrated circuits decreases, complexity and interconnectivity increases. To accommodate the growing demand of interconnections in modern integrated circuits, on-chip interconnections have been developed. Such interconnections generally consist of multiple layers of metallic conductor lines embedded in low dielectric constant materials. The dielectric constant in such materials has a very important influence on the performance of an integrated circuit. Materials having low dielectric constants (i.e., below 2.2) are desirable because they allow faster signal velocity and shorter cycle times. Moreover, lowering of the dielectric constant reduces capacitive effects, leading often to less cross talk between conductor lines and lower voltages to drive integrated circuits.

One way of achieving low dielectric constants in the insulator materials is to employ materials with inherently low dielectric constants. Generally, two different classes of low dielectric constant materials have been employed in recent years—inorganic oxides and organic polymers. Inorganic oxides often have dielectric constants between 3 and 4, and have been widely used in interconnects with design rules larger than 0.25 μm. As the dimensions of the interconnects shrink, materials with a lower dielectric constant become more desirable. Organic polymers have shown many advantageous properties including high thermal stability, ease of processing, low stress/TCE, low dielectric constant and high resistance, and are therefore considered as alternative low dielectric constant polymers for the 0.18 μm and subsequent generations of increasingly smaller dimensions.

With respect to other properties, desirable dielectrics should also be free from moisture and out-gassing problems, have suitable adhesive and gap-filling qualities, and have suitable dimensional stability towards thermal cycling, etching, and CMP processes (i.e., chemical mechanical polishing). Suitable dielectrics should also have Tg values (glass transition temperatures) of at least 300° C., and preferably 500° C. or more.

Extrapolating the needs to design rules of 0.07 μm and below suggests a strong need for materials having dielectric constant lower than 2.2. This has led to the development of dielectric materials with designed-in nanoporosity. Since air has a dielectric constant of about 1.0, a major goal is to reduce the dielectric constant of nanoporous materials down towards a theoretical limit of 1.

Several approaches are known in the art for fabricating nanoporous materials. In one approach, a thermostable polymer is blended with a thermolabile (thermally decomposable) polymer. The blended mixture is then crosslinked and the thermolabile portion thermolyzed. Examples are set forth in U.S. Pat. No. 5,776,990 to Hedrick et al. In another approach, thermolabile blocks and thermostable blocks alternate in a single block copolymer. The block copolymer is then heated to thermolyze the thermolabile blocks. In a third approach, thermostable blocks and thermostable blocks carrying thermolabile portions are mixed and polymerized to yield a copolymer. The copolymer is subsequently heated to thermolyze the thermolabile blocks. In yet a fourth approach, small hollow glass spheres are introduced into a material. Examples are given in U.S. Pat. No. 5,458,709 to Karnezaki and U.S. Pat. No. 5,593,526 to Yokouchi.

Regardless of the approach used to introduce the voids, structural problems are frequently encountered in fabricating nanoporous materials. Among other things, increasing the porosity beyond a critical extent (generally about 30% in the known nanoporous materials) tends to cause the porous materials to collapse. Collapse can be prevented to some degree by adding crosslinking additives that couple thermostable portions with other thermostable portions, thereby producing a more rigid network. electrical properties of the polymer might be disadvantageously altered, especially when relatively complex crosslinking functionalities are employed.

In summary, various methods are known to crosslink polymers in nanoporous materials. However, current methods frequently complicate the synthesis of monomers, or tend to interfere with either the polymerization reaction or physicochemical properties of nanoporous materials. Surprisingly, despite great efforts to improve various properties in nanoporous materials, and considerable work in improving crosslinking in nanoporous materials, there is no general method for crosslinking (a) without relying on exogenous crosslinking molecules, and (b) without adding pendent functionalities to the monomers. Therefore, there is still a need for methods and compositions that circumvent these limitations.

SUMMARY OF THE INVENTION

The present invention provides methods and compositions in which nanoporous materials are fabricated from fluorinated and nonfluorinated polymers having backbones with flexible structural moieties and with reactive groups used in crosslinking.

In one aspect of preferred embodiments, the reactive groups in the backbone comprise a diene and a dienophile. In still more preferred embodiments, the diene comprises a tetracyclone and the dienophile comprises an ethynyl in the form of a tolanyl.

In another aspect of preferred embodiments the reactive groups in the backbone are included in a conjugated system. In especially preferred embodiments the polymeric strands comprise a fluorinated poly(arylene ether) synthesized from a fluorinated difluoroaromatic portion and a fluorinated aromatic bisphenolic portion. In still more preferred embodiments, the difluoroaromatic portions of the poly (arylene ether) are modified in such a way, that some difluoroaromatic portions carry a thermolabile portion.

In still other aspects of preferred embodiments, crosslinking occurs without reliance on an exogenous crosslinker.

Various objects, features, aspects and advantages of the present invention will become more apparent from the following detailed description of preferred embodiments of the invention, along with the accompanying drawings in which like numerals represent like components.

DETAILED DESCRIPTION

Figure 3:
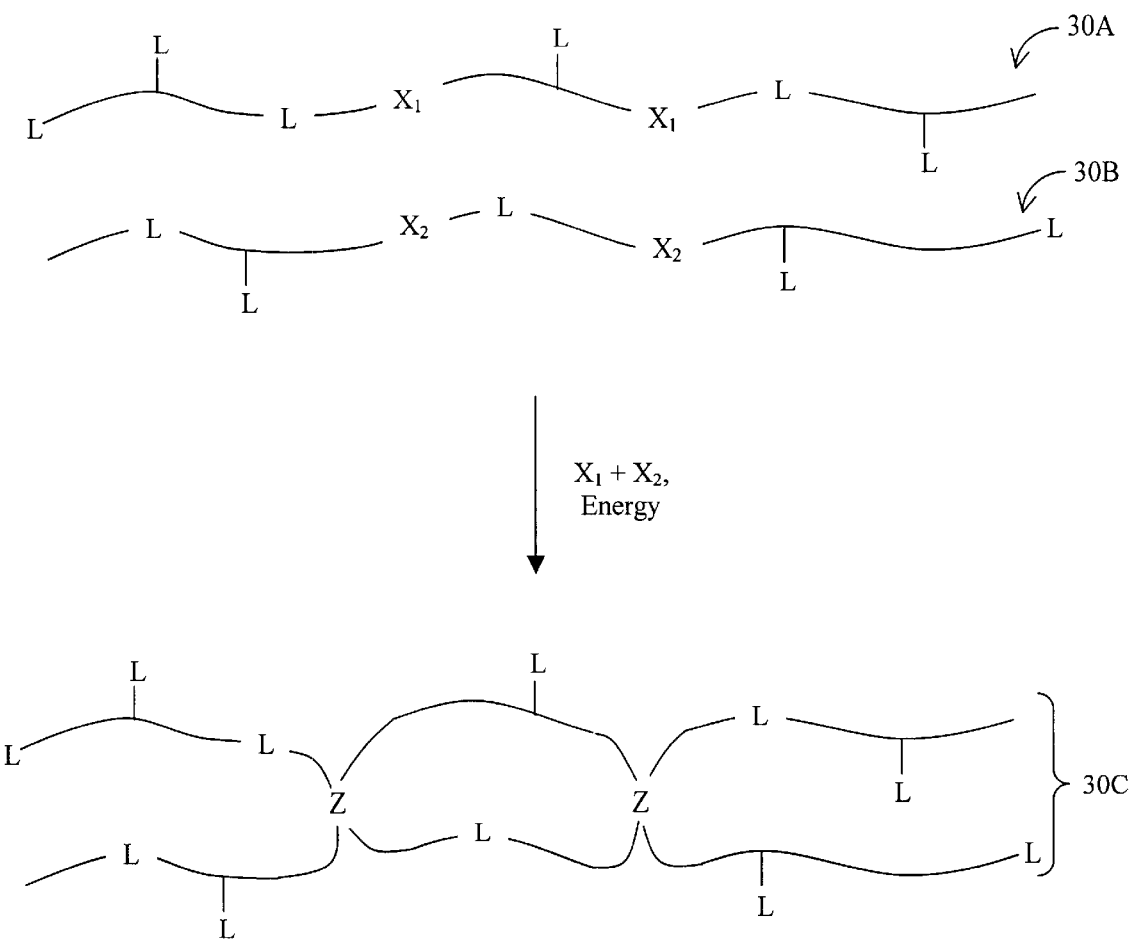
FIG. 3 is a scheme depicting crosslinking of polymeric strands containing thermolabile groups according to one aspect of the inventive subject matter.

In FIG. 3, two polymeric strands 30A, 30B carry a plurality of thermolabile groups L. Each of the polymeric strands defines a backbone, and each of the backbones includes reactive groups $X_1$ and $X_2$. Strands 30A and 30B are crosslinked in a crosslinking reaction between reactive groups $X_1$ and $X_2$ without addition of an exogenous crosslinking molecule. The crossing reaction results in crosslinks Z, thereby covalently connecting, or possibly further connecting strands 30A, 30B to form polymer 30C. In a further step (not shown) the thermolabile groups L are thermolyzed, leaving voids. When the voids are sufficiently small and sufficiently well distributed, the resulting material thus becomes a nanoporous polymer.

Figure 4:
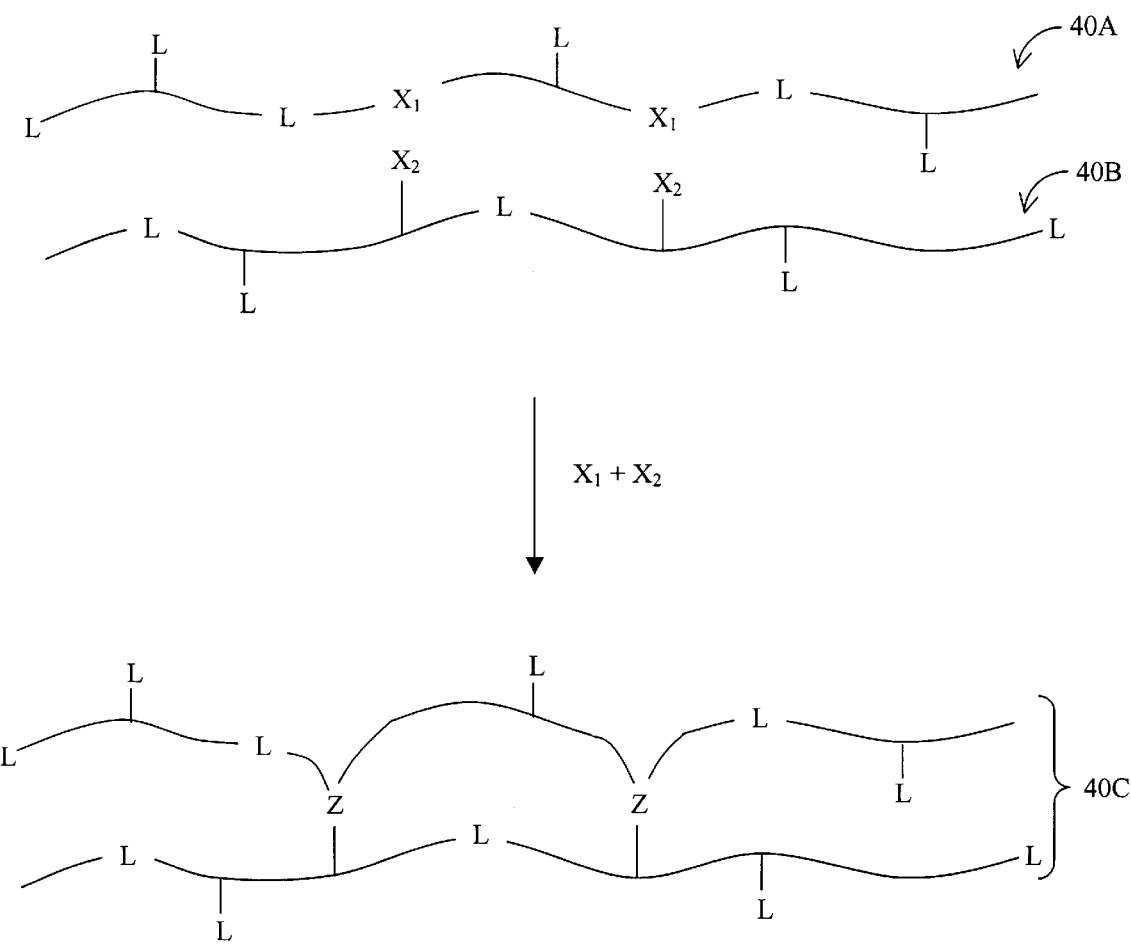
FIG. 4 is a scheme depicting crosslinking of polymeric strands containing thermolabile groups according to another aspect of the inventive subject matter.

FIG. 4 is quite similar to FIG. 3, except that reactive group $X_1$ forms part of the backbone in strand 40A, while reactive group $X_2$ is pendent to the backbone in strand 40B. Nevertheless, the crosslinking reactions proceed, resulting in crosslinks Z and a crosslinked polymer 40C.

The schemes set forth in FIGS. 3 and 4 are intended to be viewed in a generalized manner. As used herein, for example, the term "polymeric strand" refers to any composition of monomers covalently bound to define a backbone, and may include any pendant groups other than those coupled via crosslinking.

The term "monomer" as used herein refers to any chemical compound that is capable of forming a covalent bond with itself or a chemically different compound in a repetitive manner. The repetitive bond formation between monomers may lead to a linear, branched, super-branched or three-dimensional product. Monomers may belong to various chemical classes of molecules including organic, organometallic or inorganic molecules. Examples of organic monomers are acrylamide, vinyl chloride, fluorene bisphenol or 3,3'-dihydroxytolane. Examples of organosilicon monomers are octamethylcyclotetrasiloxane, methylphenylcyclotetrasiloxane, etc. Examples of inorganic monomers that lead to inorganic $SiO_2$ or $Al_2O_3$ structures include the most commonly used tetraethoxysilane (TEOS) and aluminum ethoxide. The molecular weight of monomers may vary greatly between about 40 Dalton and 20000 Dalton. Monomers may also include thermolabile groups or functionalities for crosslinking. For example, monomers may comprise poly(propylene oxide), polycarbonates, poly (methylmethacrylate), various styrenic polymers, or ethynyl- or tetracyclone groups. It is also contemplated that monomers may be halogenated, whereby a preferred halogen is fluorine. Halogenation, and especially fluorination may advantageously reduce the dielectric constant of the monomer, and indirectly reduce the dielectric constant of the nanoporous polymer.

Under these definitions, polymeric strands may thus be linear, branched, super-branched, or three-dimensional, and may include thermolabile portions and reactive groups. Polymeric strands may belong to any chemical class, including organic or inorganic compositions. Examples of organic polymeric strands are polyimides, polyesters, or polybenzils. Examples of organosilicon polymeric strands are various substituted polysiloxanes. Examples of inorganic polymeric strands include silica or alumina. Polymeric strands may also comprise a wide range of functional or structural moieties, including aromatic systems, and halogenated groups, including a fluorine atom, or a —$CF_3$ group. Polymeric strands may also have additional reactive groups capable of participating in a chemical reaction. The molecular weight of contemplated polymeric strands span a wide range, typically between 400 Dalton and 400000 Dalton or more.

Especially preferred polymeric strands are those having a ring system, and having backbone crosslinking groups comprising a diene and a dienophile. A particularly preferred class comprises strands in which the diene is the cyclopentadienone of a tetracyclone. Such strands can advantageously comprise fluorinated or non-fluorinated polybenzils, and can be prepared from a fluorinated or non-fluorinated difluoroaromatic compound and a fluorinated or nonfluorinated aromatic bisphenolic compound. In more preferred embodiments the aromatic bisphenolic compound comprises a fluorene bisphenol, and the difluoroaromatic compound comprises a tolane. In even more preferred embodiments, the difluoroaromatic compound comprises a tetracyclone.

Other preferred embodiments may be characterized by a modification of the aromatic portion of the aromatic bisphenolic compound, or modification of the aromatic portion of the difluoroaromatic compound. Such modifications may include isomeric variations, or addition or removal of aromatic groups. For example, a tetracyclone, halogens, amides, alcohols, aliphatic or aromatic substituents may be introduced into an aromatic portion of a 3,3'-dihydroxytolane. Analogous changes are also contemplated for the aromatic portion of a 4,4'-difluorobenzil. In yet another class of variations, an $sp^2$-hybridized carbon atom may be replaced by any other appropriate atom, including sulfur, oxygen, nitrogen, etc. When the modification comprises an introduction of a halogen, and especially a fluorine, it is contemplated that one or more than one fluorine atom can be covalently bound to an aromatic carbon atom, or that one or more than one fluorine atom may be covalently bound to a non-aromatic carbon atom. Alternatively, at least one fluorine atom may also be covalently bound to a non-aromatic carbon atom while at least one fluorine atom may be covalently bound to an aromatic carbon atom.

In further alternative embodiments, the polymeric strands may be completely different from a polybenzil. Alternative polymeric strands include organic, organometallic or inorganic polymers. Examples of contemplated organic polymers are polyimides, polyesters and polycyanurates. Examples of contemplated organometallic polymers are poly(dimethylsiloxane) and poly(vinylsiloxane). Examples of contemplated inorganic polymers are polysilicates and polyaluminates. Indeed, contemplated polymeric strands need not comprise a single type of monomer, but may comprise a mixture of various non-identical monomers.

As used herein, the term "backbone" refers to a contiguous chain of atoms or moieties forming a polymeric strand are covalently bound such that removal of any of the atoms or moiety would result in interruption of the chain. Preferred backbones comprise an aromatic ring system, or at least a conjugated group. There are, however, many other combinations contemplated. For example, contemplated backbones may include any elements, including especially C, N, O, S, P, Si, and Al. Furthermore, contemplated backbones may include aromatic groups including phenyl-, substituted or unsubstituted cyclopentadienyl groups, thermolabile groups, aromatic ring systems, and fluorinated or other reactive groups.

As used herein, the term "crosslinking" refers to a process, in which at least two molecules, or two portions of a long molecule, are joined together by a chemical interaction. Such interactions may occur in many different ways including formation of a covalent bond, formation of hydrogen bonds, hydrophobic, hydrophilic, ionic or electrostatic interaction. Furthermore, molecular interaction may also be characterized by an at least temporary physical connection between at least one molecule with itself or between two or more molecules. Therefore, it is contemplated that a polymeric strand according to the inventive subject matter may crosslink with itself.

Crosslinking is typically mediated by various reactive groups, and may occur by numerous mechanisms. If a covalent bond is formed between two reactive groups, it may be formed by a variety of chemical reaction mechanisms, including additions, eliminations or substitutions. Examples are nucleophilic or electrophilic addition, E1- or E2-type eliminations, nucleophilic and aromatic substitutions. Crosslinking may be a spontaneous process or may require energy or a catalyst. Examples of such energy are thermal energy, radiation, mechanic, electric or electromagnetic energy. Examples of catalysts are acids, bases, and palladium-coated activated charcoal. In yet further alternative embodiments, crosslinking may or may not involve extrinsic crosslinkers, and any extrinsic crosslinker may comprise single molecules, crosslinking molecules may also themselves be oligomeric or even polymeric.

It is also contemplated that the number of reactive groups in a strand that are used for crosslinking may vary widely. This would typically depend on the strength of crosslinking required, as well the strength of the individual crosslinking links. For example, to form a stable crosslink at room temperature between two single strands of nucleic acids, a minimum of about 25–30 hydrogen bonds is required. In contrast, only one covalent bond is needed to achieve a crosslink with even higher stability. It is also contemplated that the number of reactive groups participating in crosslinking may vary within a wide range. For example, crosslinking may involve as little as 5% of reactive groups, but may also involve more than 90% of all available reactive groups in the polymeric strands. Although preferred reactive groups are not identical to one another, it is also contemplated that all of the reactive groups may be identical to one another.

The term "reactive group" as used herein refers to any elements or combinations of elements having sufficient reactivity to be used in crosslinking or coupling with a pendent group. Reactive groups are contemplated to be positioned in any part of a backbone, including the termini. In preferred embodiments, the diene may comprise a tetracyclone and the dienophile may comprise an ethynyl group. In other embodiments, alternative reactive groups may include nucleophilic or electrophilic centers.

The term "thermostable" as used herein refers to the tendency of a material to resist elevated temperatures, typically in the range of 300° C. to 450° C. In a preferred embodiment, the thermostable portion of the polymer comprises a polybenzil. In a more preferred embodiment, the polybenzil is prepared from a difluoroaromatic compound and an aromatic bisphenolic compound, wherein both compounds may be fluorinated. In an even more preferred embodiment, the aromatic bisphenolic compound comprises a fluorene bisphenol, and the difluoroaromatic compound comprises a tolane. In further preferred embodiments, the difluoroaromatic compound comprises a tetracyclone.

The term "thermolabile" as used herein refers to the property of a material to degrade above an elevated temperature, typically in the range of 250° C. to 400° C. It should be understood that the thermolabile groups of FIGS. 3 and 4 may be positioned in any part of the backbones, including the termini. Preferred thermolabile groups include polypropyleneoxide, polylactides, polycarbonates or polymethylmethacrylate. In a preferred embodiment, the thermolabile portion is attached to a polybenzil polymer within a difluoroaromatic portion in the polymeric chain, and comprises an ethylene glycol-poly(caprolactone). In more preferred embodiments, at least 5–25% of the difluoroaromatic portion carries an ethylene glycol-poly(caprolactone) with an average molecular weight of 3000 Dalton.

Thermolabile groups L may advantageously include a connector moiety. The term "connector moiety", however, should be interpreted broadly herein to mean any kind of chemical moiety that is capable of reacting with a reactive group in a polymer. Many types of reactions, including substitutions, eliminations and additions, may be involved to form a covalent bond. Examples are esterification, amidation, epoxidation, etc. The size of the connector moiety may vary considerably from molecular weights of about 20 Dalton to about and above 500 Dalton. Examples of relatively small connector moieties are acidic groups, basic groups, nucleophilic groups and electrophilic groups. Alternative small connector moieties are, for example, R—$CO_2$H, R—CO—R', R—$NH_2$, R—SH, R-Halogen and so on. Examples of larger connector moieties are tetracyclones, cyclopentadiene groups or bifunctional aliphatic groups, including especially 1,2-diaminobenzenes or 1,3-diphenylpropan-2-ones. It is still further contemplated that alternative connector moieties need not have a single type of functional group or single type of substituent, but alternative connector moieties may also be a mixture of various non-identical connector moieties.

It is further contemplated that alternative connector moieties need not engage in formation of a covalent bond. Appropriate alternative connectors may also engage in non-covalent coupling including hydrophobic-, electrostatic-ionic interactions, complex formation or hydrogen bonding. Examples are leucine zipper-like structures, highly polar groups, polycationic groups or polyanionic groups, and polydentate-type groups. Chemical bonds between a connector moiety and a polymer may be formed at various positions in the polymeric strand, including positions at the ends of the intermediate. Connector moieties may also be located in any part of the thermolabile group including the termini.

The term "degrade" as used herein refers to the breaking of covalent bonds. Such breaking of bonds may occur in many ways, including heterolytic, radical, and homolytic breakage. The breaking of bonds need not be complete, i.e. not all breakable bonds must be cleaved. Furthermore, the breaking of bonds may occur in some bonds faster than in others. Ester bonds, for example, are generally less stable than amid bonds, and are therefore cleaved at a faster rate. Breakage of bonds may also result in the release of fragments differing from one another, depending on the chemical composition of the degraded portion. The energy involved in thermolysis may comprise thermal, electromagnetic, mechanical energy, particulate or non-particulate radiation. For example, an appropriate energy could be alpha-radiation, sonication, microwaves or heating.

It is contemplated therefore that methods disclosed herein can advantageously be employed in the fabrication of numerous nanoporous materials—the general process including the steps of: providing a plurality of polymeric strands wherein each of the polymeric strands includes a thermolabile portion, and defines a backbone including a plurality of reactive groups; providing a first energy to crosslink the polymeric strands using at least one of the reactive groups; and providing a second energy to at least partially degrade the thermolabile portion.

By varying the polymeric strands employed in the process, a great variety of nanoporous materials can be fabricated. As used herein the term "nanoporous material" refers to any material that includes a significant number of voids with diameters in a range of about 1 nm to about 1000 nm. Contemplated compositions for nanoporous materials include synthetic polymers, inorganic material, and organosilicon compounds. Examples of synthetic polymers are polyethers, polyimides or polyesters. Examples of inorganic material include silica or aluminosilicates as well as ceramic materials. Examples of organosilicon compounds include poly(dimethylsiloxane), poly(vinylsiloxane) and poly(trifluoropropylsiloxane).

Nanoporous materials may be characterized by the extent to which mass is replaced with a gas. The composition of the gas is generally not critical, and appropriate gases include relatively pure gases and mixtures thereof. Air (which is predominantly a mixture of $N_2$ and $O_2$) is commonly disposed in the "voids" of nanoporous materials, but pure gases such as nitrogen, helium, argon, $CO_2$ or CO are also contemplated. Nanoporous materials may also be characterized by the structure of the voids. Nanoporous materials typically include spherical voids, but may alternatively or additionally include tubular, lamellar, discoidal, and voids having other shapes. Moreover, some of the voids in nanoporous material maybe substantially larger or smaller than about 1 $\mu$m. Nanoporous materials may have many different forms, including but not limited to thin films, plates, spheres, blocks or cylinders. Nanoporous materials may also comprise additional materials, including fillers, surfactants and plasticizers.

With respect to the step of providing a first energy, the energy preferably comprises a thermal energy, and in particular embodiments is used to heat the strands to about 250° C. for 30 min. Viewed from another perspective, the first energy is preferably sufficient to involve at least 20% of all available reactive groups in the crosslinking. Heating, however, may alternatively involve any suitable temperatures, including temperatures between 150° C. and 250° C. In further alternative embodiments, the period of heating may vary greatly, from a few seconds or less, to several hours or more. In yet further alternative embodiments, the first energy need not be thermal energy, but may involve any suitable form of energy including various electromagnetic radiations (e.g., are UV-, laser-, X-rays or infrared irradiation), mechanical energy (e.g. sonication or physical pressure), and particle radiation (e.g., alpha- or beta-radiation).

With respect to the degradation step, the energy is again preferably a thermal energy. In specific embodiments such heating may advantageously reach a temperature of about 350° C. for approximately 20 minutes. In alternative embodiments the temperature may vary considerably, depending on the nature of the thermolabile and thermostable portion of the crosslinked polymeric chains. Contemplated temperatures range from 200° C. or less, to about 450° C. or more. In further alternative embodiments, the time required to degrade the thermolabile portion is contemplated to vary greatly from less than a few seconds to at least several hours. Once again it is contemplated that the energy employed may vary from purely thermal energy.

Figure 1:
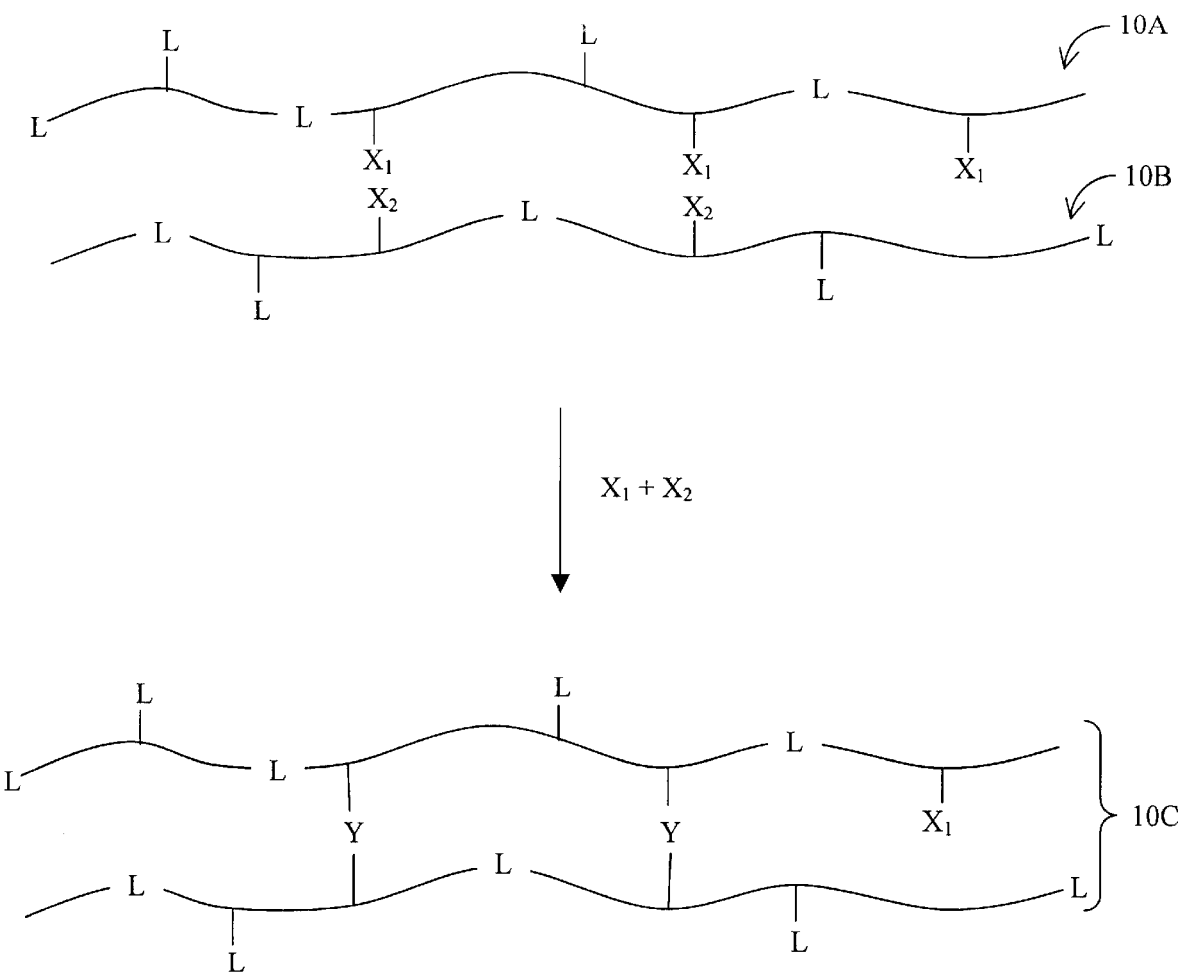
FIG. 1 is a prior art scheme depicting crosslinking of polymeric strands containing thermolabile groups.

The nanoporous polymers described herein are similar in some respects to those described in U.S. Pat. No. 5,874,516 to Burgoyne et al. (February 1999), incorporated herein by reference, and may be used in substantially the same manner as set forth in that patent. For example, it is contemplated that nanoporous polymers described herein may be employed in fabricating multichip modules, interlayer dielectrics, protective coatings, and as a substrate in circuit boards or printed wiring boards. Moreover, films or coatings of the nanoporous polymers described herein can be formed by solution techniques such as spraying, spin coating or casting, with spin coating being preferred. Preferred solvents are 2-ethoxyethyl ether, cyclohexanone, cyclopentanone, toluene, xylene, chlorobenzene, N-methyl pyrrolidinone, N,N-dimethylformamide, N,N-dimethylacetamide, methyl isobutyl ketone, In general, two different techniques are known in the art to crosslink thermostable portions in nanoporous materials. In one technique, specific crosslinking functionalities are already incorporated into the polymer. Such functionalities react together to crosslink polymers prior to thermolysis of the thermolabile portion. For example, it is known to include a tolanyl function in a block copolymer and to use the ethynyl functions to crosslink polyimide polymers. This is depicted graphically in prior art FIG. 1, in which two independent polymeric strands 10A, 10B carry crosslinking functionalities X1 and X2 as pendent groups, and thermolabile portions L as both pendent groups and as part of the backbones. As crosslinking proceeds, X1 and X2 react to form crosslinks Y, thereby covalently connecting the two strands 10A, 10B into a single crosslinked polymer 10C.

Figure 2:
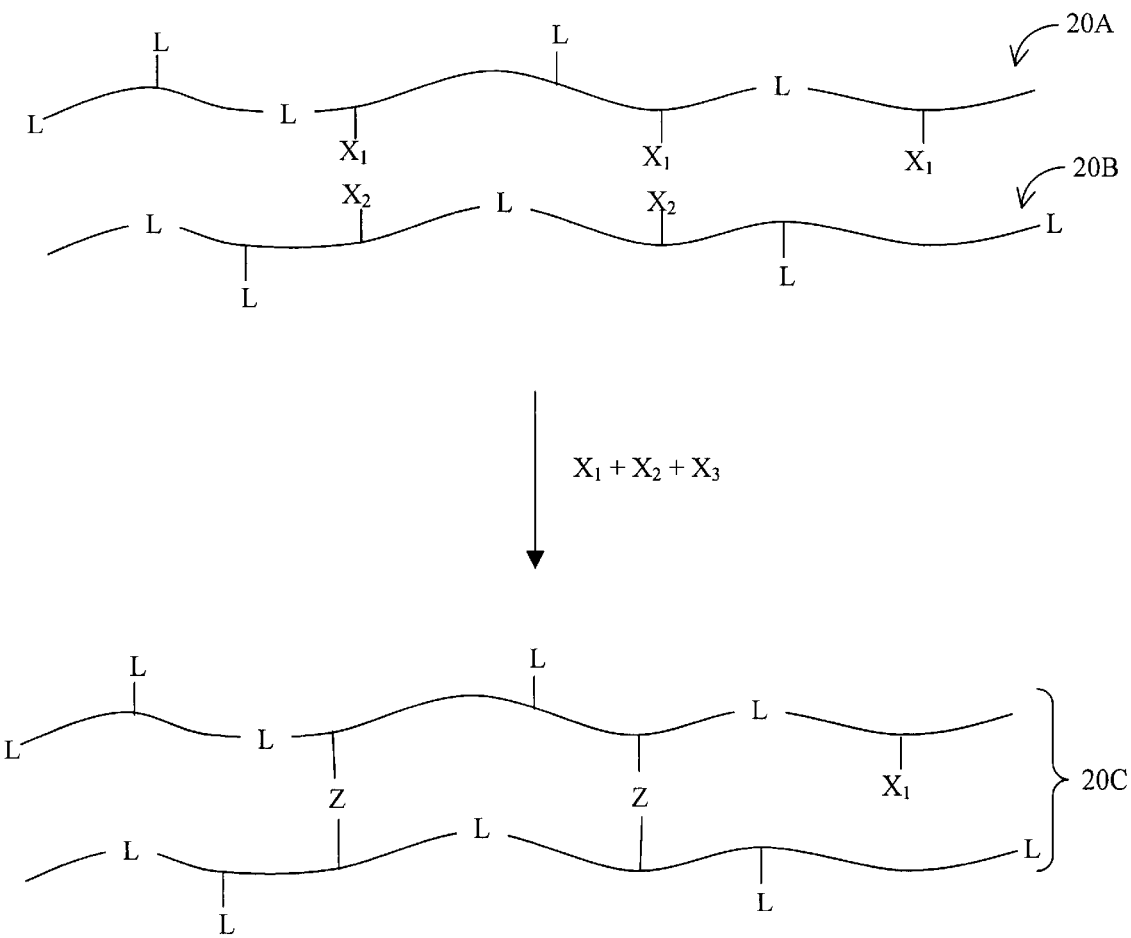
FIG. 2 is a prior art scheme depicting crosslinking of polymeric strands containing thermolabile groups, using an exogenous crosslinking molecule.

In the other technique, exogenous crosslinking molecules are employed in crosslinking. The crosslinked polymer is then heated to thermolyze the thermolabile portion. In U.S. Pat. No. 5,710,187 to Streckle, Jr., for example, aromatic monomers are crosslinked using exogenously added multifunctional acyl- or benzylic halides. This is depicted graphically in prior art FIG. 2, in which two independent polymeric strands 20A, 20B again carry crosslinking functionalities X1 and X2 as pendent groups, and thermolabile portions L as both pendent groups and as part of the backbones. As crosslinking proceeds, X1 and X2 react with an exogenous crosslinking molecule X3, thereby forming crosslinks Y, and covalently connecting the two strands 20A, 20B into a single crosslinked polymer 20C.

Crosslinking of thermostable portions in nanoporous materials has significant limitations. Among other things, the use of exogenous crosslinking molecules requires that the crosslinkers specifically react with the thermostable portion without interfering with the polymerization reaction. Furthermore, the crosslinkers must be soluble in the same solvent system as the blockpolymers or monomers. Therefore, the chemical structure and reactivity of the thermostable portion and thermolabile portion frequently dictate the nature of the exogenous crosslinking molecules. Another limitation is that the use of "built-in" specific crosslinking functionalities in a polymer increases the complexity of the polymer, thereby often compounding difficulties in the synthesis of monomers. Adding functionalities may also interfere with the polymerization reaction, and the mechanical and 2-methoxyethyl ether, 5-methyl-2-hexanone, γ-butyrolactone, and mixtures thereof. Typically, the coating thickness is between about 0.1 to about 15 microns. As a dielectric interlayer, the film thickness is less than 2 microns. Additives can also be used to enhance or impart particular target properties, as is conventionally known in the polymer art, including stabilizers, flame retardants, pigments, plasticizers, surfactants, and the like. Compatible or non-compatible polymers can be blended in to give a desired property. Adhesion promoters can also be used. Such promoters are typified by hexamethyidisilazane, which can be used to interact with available hydroxyl functionality that may be present on a surface, such as silicon dioxide, that was exposed to moisture or humidity. Polymers for microelectronic applications desirably contain low levels (generally less than 1 ppm, preferably less than 10 ppb) of ionic impurities, particularly for dielectric interlayers.

EXAMPLES

Figure 5:
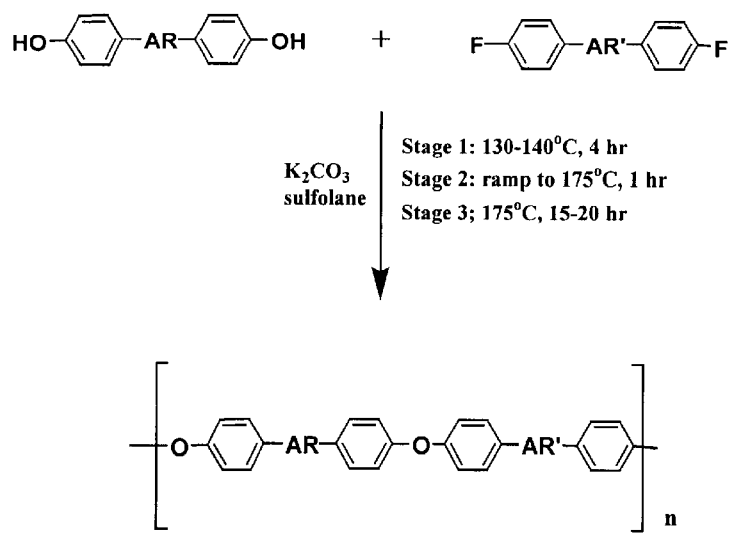
FIG. 5 is a general synthetic scheme for fabricating poly(arylene ethers).

The following examples demonstrate the principles of the inventive subject matter. A general synthetic scheme for fabricating poly(arylene ethers) polymeric strands is depicted in FIG. 5. AR and AR' can independently comprise any suitable thermally stable structure with a preponderance of aromatic or fused aromatic portions, and in the examples in FIG. 5 HO—$C_6H_4$-AR-$C_6H_4$—OH is fluorene bisphenol, and F—$C_6H_4$-AR'-$C_6H_4$—F is a difluoroaromatic compound containing at least one tolane moiety.

A general synthetic procedure for the nucleophilic aromatic substitution as exemplified by a reaction between fluorene bisphenol and 4-fluoro-3'-(4-fluorobenzoyl)tolane is as follows: 1 L 3-neck RB flask, equipped with an magnetic stirrer, a thermocouple, a Dean-Stark trap, a reflux condenser and $N_2$ inlet-outlet connection was purged by $N_2$ for several hours and fed with 0.2 L warm sulfolane. At 70–80° C., 35.042 g (0.1000 Mol) of fluorene bisphenol (FBP), 31.8320 g (0.1000 Mol) of 4-fluoro-3'-(4-fluorobenzoyl)-tolane (FBZT) and 27.64 g (0.2 Mol) of Potassium carbonate were added and rinsed by 165mL of warm sulfolane and 165mL of toluene. The reaction mass was heated to 140° C. and azeotroped at this temperature for 1–2 hours, then temperature was gradually raised to 175° C. by removing of toluene and reaction was continued at 175° C. with azeotroping during 15–20 h. The temperature was reduced to 165° C., 4-fluorobenzophenone was added and end-capping was continued for 5 hours. The reaction mass was diluted with 165mL of NMP and left for overnight. Then cold reaction mass was filtered through paper filter, precipitated in 5×MeOH (0.03% $HNO_3$), redisolved in NMP and reprecipitated in 5×MeOH (0.01% $HNO_3$). The precipitate was filtered using paper filter, washed on filter 3 times each with 1 L of MeOH and dried in vacuum oven for overnight at 60°–70° C.

Example 1

Figure 6A:
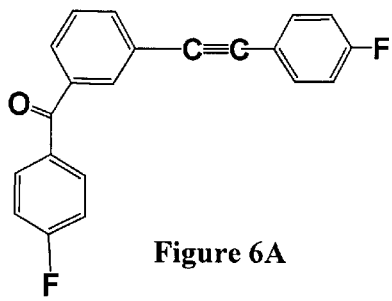
FIGS. 6A–6J are structures of contemplated difluoroaromatic compounds according to the inventive subject matter.
Figure 6B:
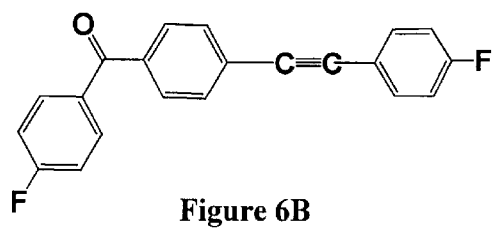
Figure 6C:
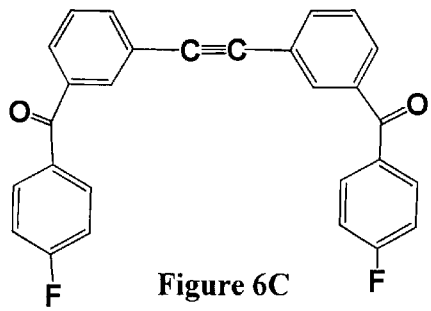
Figure 6D:
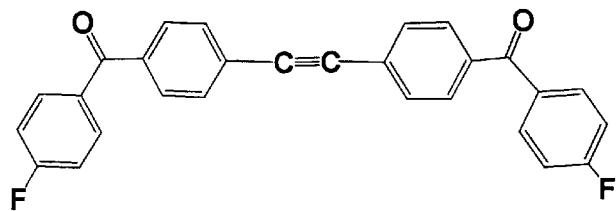
Figure 6E:
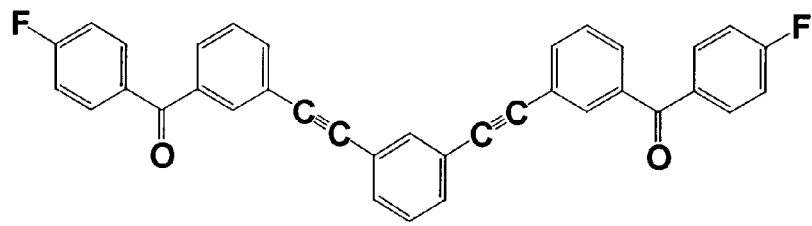
Figure 6F:
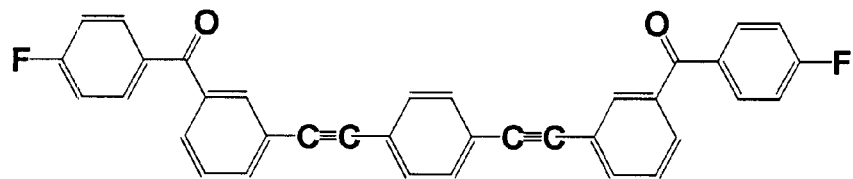
Figure 6G:
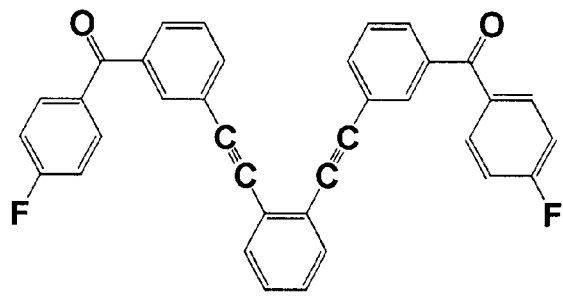
Figure 6H:
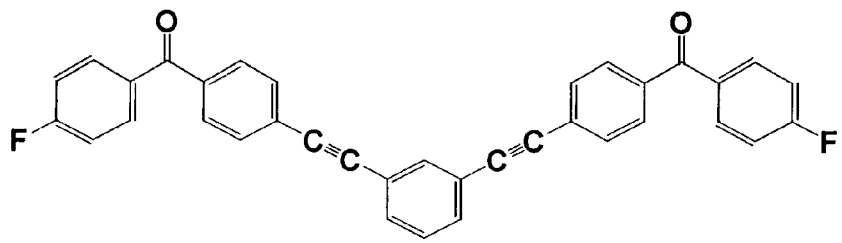
Figure 6I:
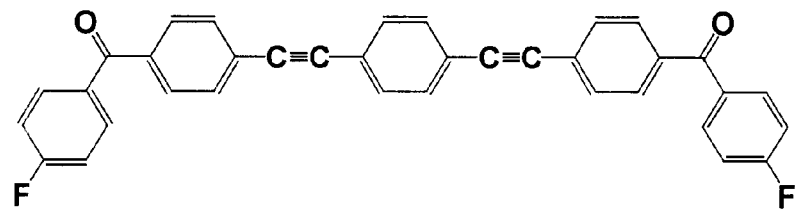
Figure 6J:
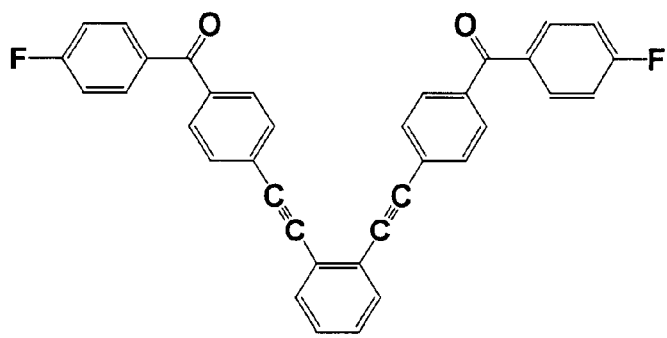

FIGS. 6A–6J are exemplary structures of difluoroaromatic compounds. These novel compositions are particularly advantageous in having flexible structural moieties built into the uncured poly(arylene ethers), thereby maintaining the polymers' flexibility, low melt viscosities, and high solubilities in common solvents, such as cyclohexanone and benign aromatic ethers such as anisole and phenetole, to facilitate solution formulation and spin-coating. A homogeneous physical blend of any of these compounds with a fluorene bisphenol can be spun onto the surface of a silicon wafer or other target surface, and then thermally activated to undergo a polymerizing and crosslinking reaction, thereby forming a thermally stable network at a temperature lower than 300° C. If thermolabile groups are grafted on (e.g., as set forth in FIG. 4), and the resulting polymer is heated further, the thermolabile groups decompose, volatilize and generate voids in the network. The resulting network possesses high glass-transition temperature in excess of 400° C. by virtue of the crosslinking reaction and its high-temperature polymer structural characteristics. A general synthetic scheme for the structures depicted in FIGS. 6A and 6B is as follows:

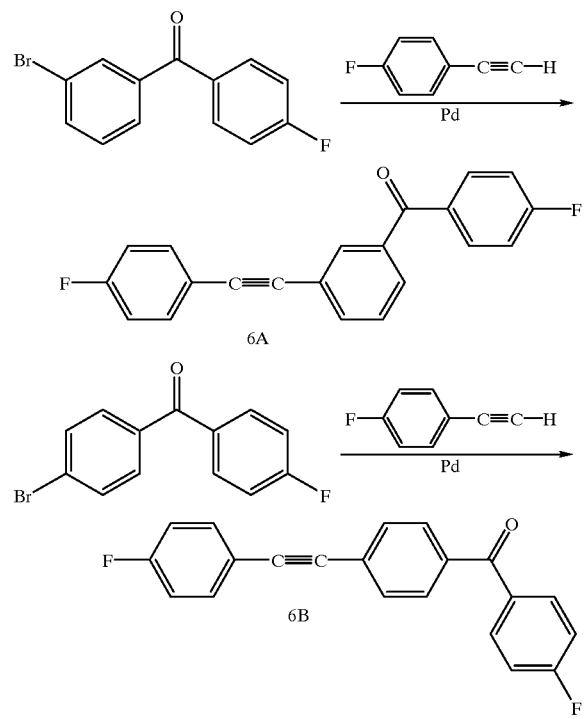

A general synthetic scheme for the structures depicted in FIGS. 6C, 6E, 6F and 6G is as follows:

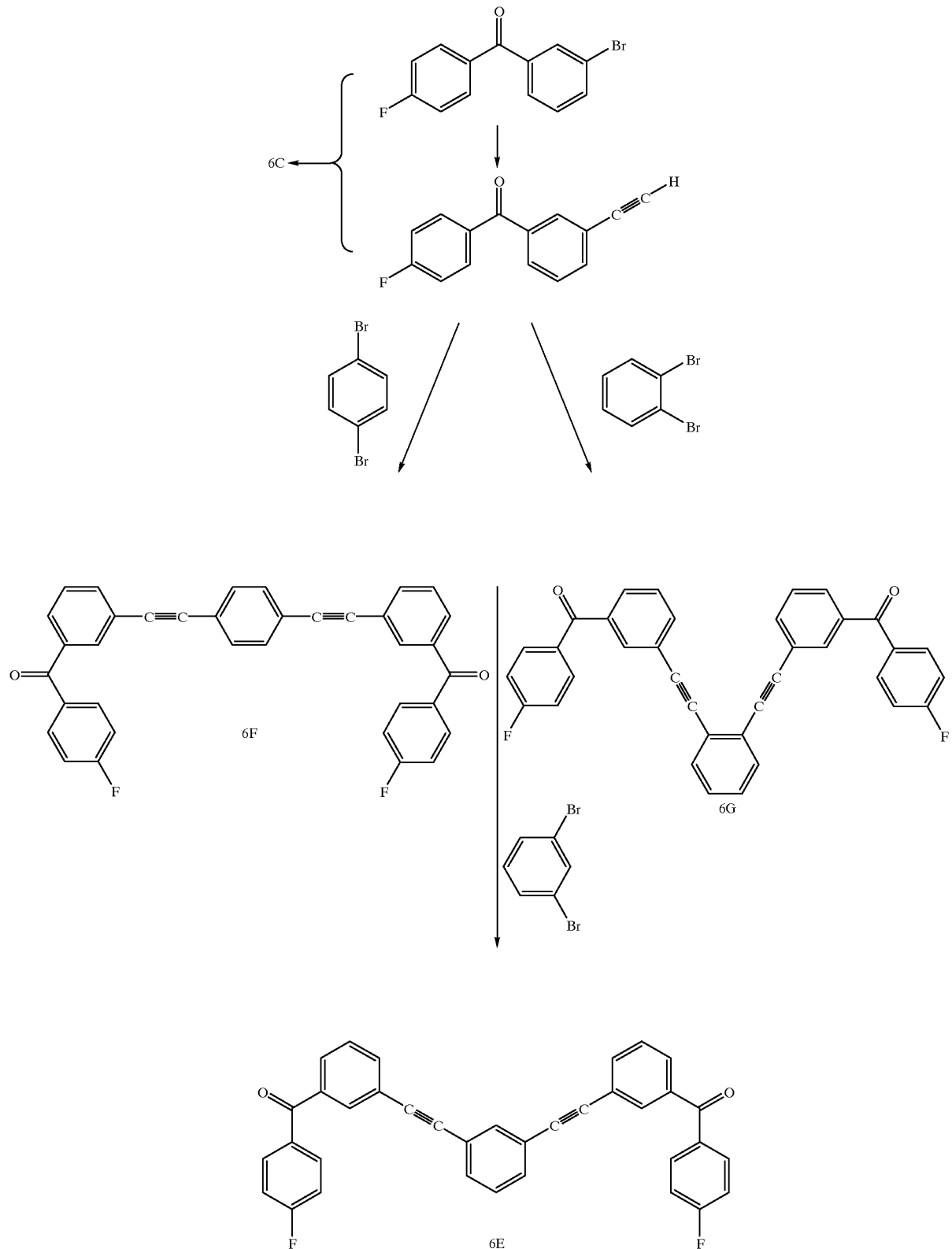
A general synthetic pathway to structures in FIGS. 6D, 6H, 6I, and 6J is as follows:

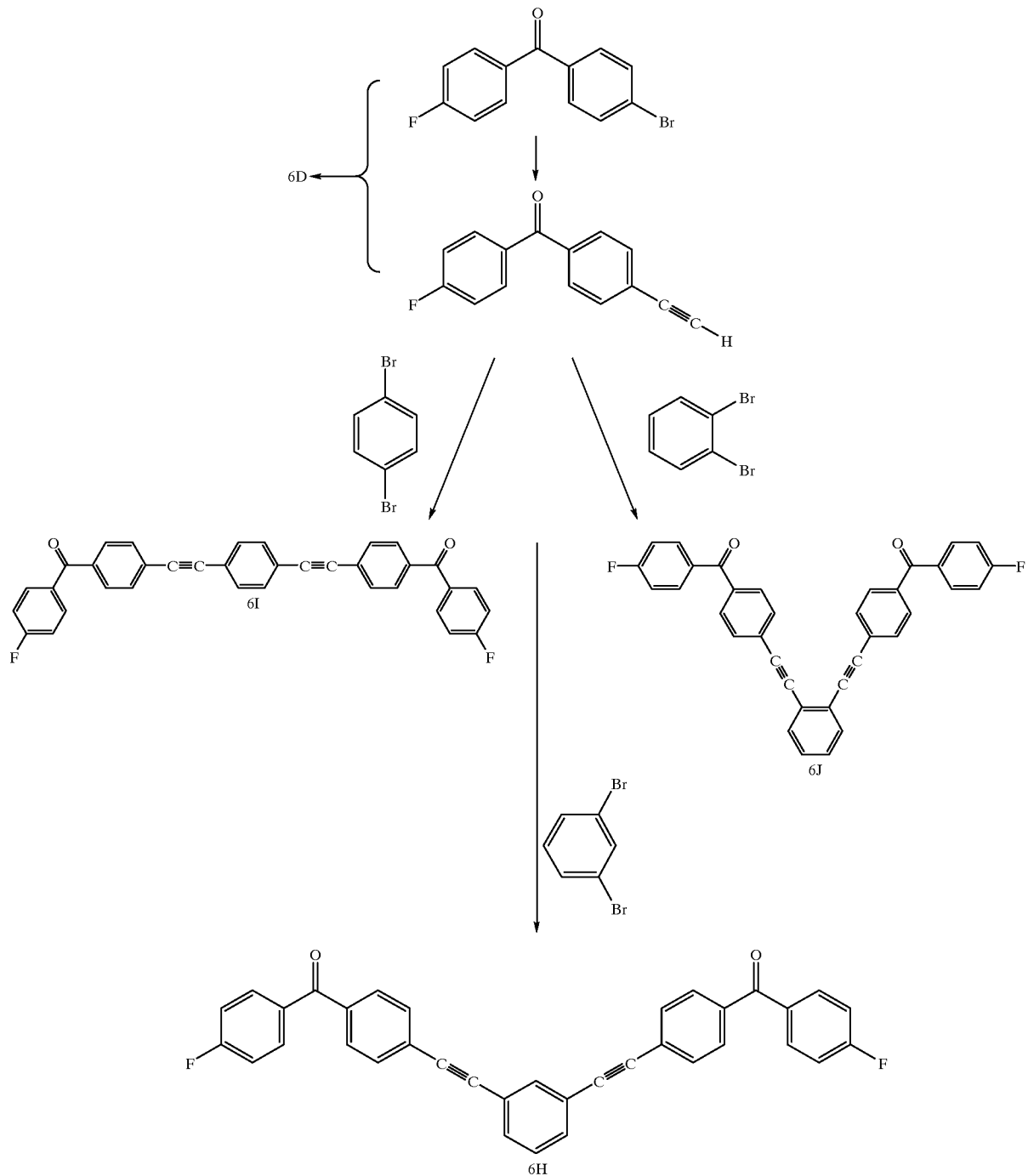

Example 2

Figure 7:
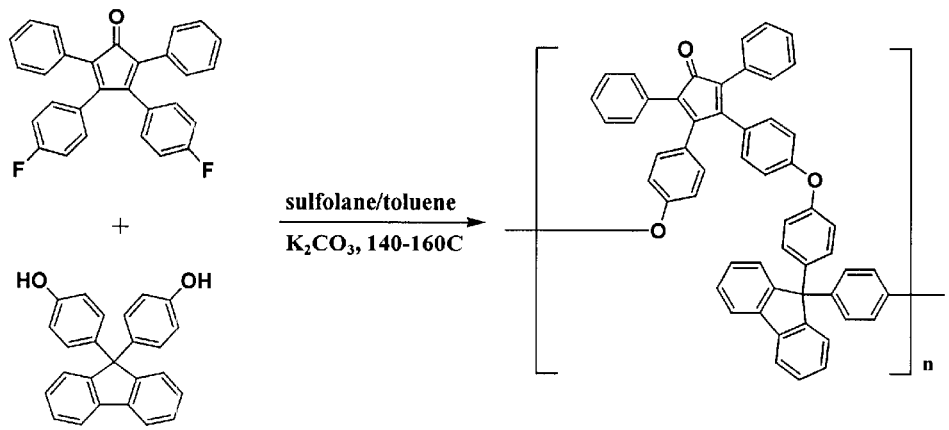
FIG. 7 is a synthetic scheme for producing a tetracyclone containing arylene ether polymer.

FIG. 7 depicts a synthetic scheme for producing a tetracyclone containing poly(arylene ether). A successful polymerization was run at 140–160° C. for 24 hr, and the polymer was worked up using the same procedure as for other poly(arylene ethers). The tetracyclone containing polymeric product is magenta red in color and possesses a final Mn of 3,000, Mw of 5,600, Mp of 5,200 with PD of 1.9. The molecular weights can be improved by running the polymerization straight at 160° C. for 24 hr instead of at 140–160° C. for 24 hr. However, moderate molecular weight species may be more advantageous due to potentially more effective cross-linking of the polymer with FLARE polymers during curing to form sexiphenylene structures with relatively low density.

Example 3

Figure 8:
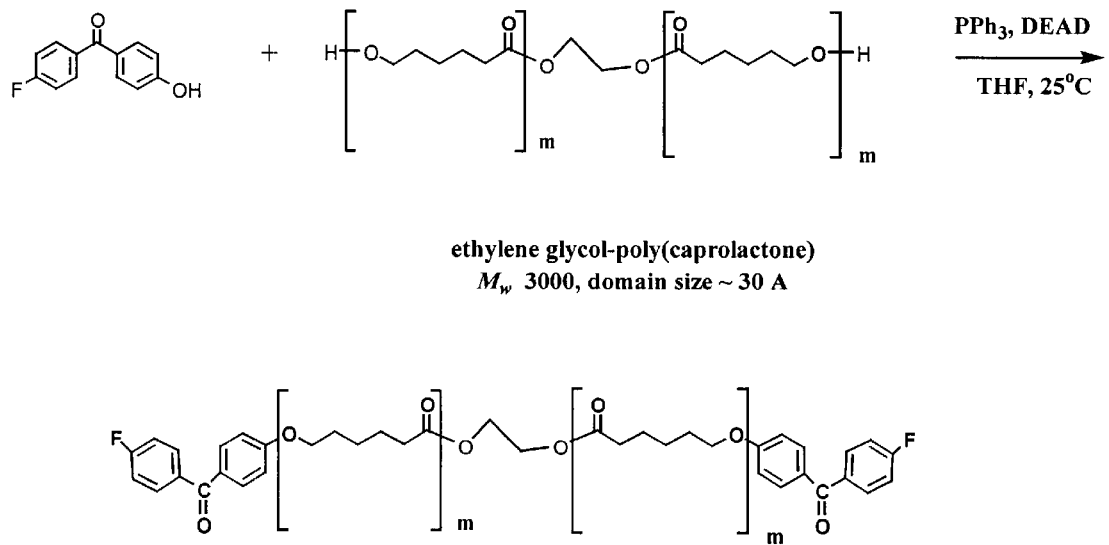
FIG. 8 is a synthetic scheme for grafting a thermally labile component to a polymeric strand.

FIG. 8 is a synthetic scheme including general reaction conditions for grafting a thermally labile component to a polymeric strand, in which 4-fluoro4'-hydroxybenzophenone is reacted in THF (DEAD, PPh$_3$) with ethylene glycol-poly(caprolactone) to produce a 4-fluorobenzophenone endcapped thermolabile polymer. The thermolabile 4-fluorobenzophenone endcapped thermolabile polymer can then be incorporated into a poly(arylene ether) together with an aromatic bisphenolic compound.

Example 4

Figure 9A:
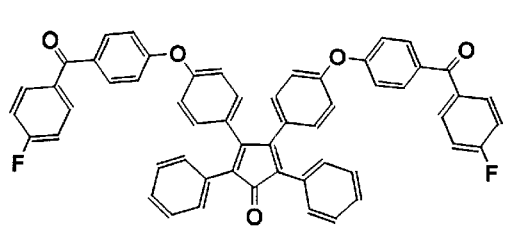
FIGS. 9A and 9B are structures of difluoroaromatic monomers that lead to tetracyclone-containing poly(arylene ethers) according to the inventive subject matter.
Figure 9B:
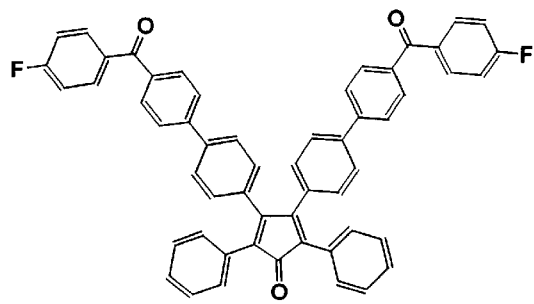

FIGS. 9A and 9B are contemplated structures of difluoroaromatic monomers that lead to tetracyclone-containing poly(arylene ethers).

Example 5

Figure 10:
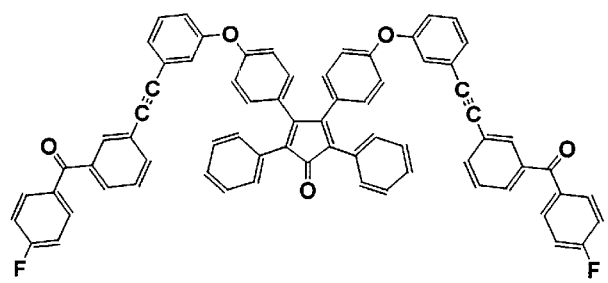
FIGS. 10 and 11 are structures of difluoroaromatic monomers that lead to tetracyclone- and ethynyl-containing poly(arylene ethers) according to the inventive subject matter.
Figure 11:
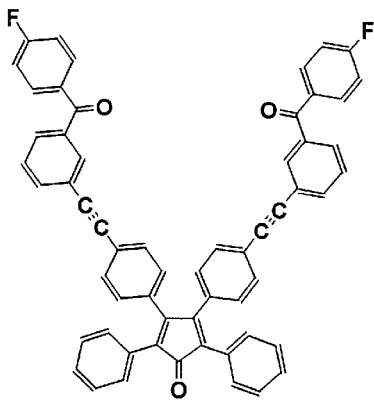
Figure 12A:
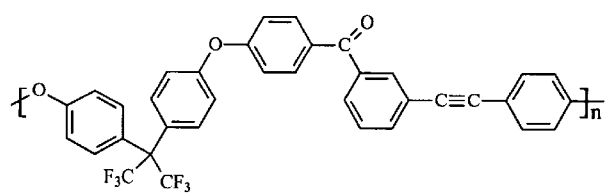
FIGS. 12A–12I are structures of repeating portions in a polymeric strand according to the inventive subject matter.
Figure 12B:
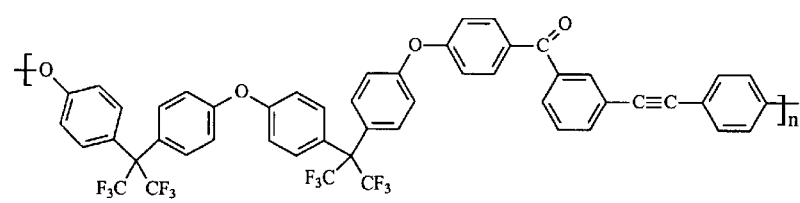
Figure 12C:
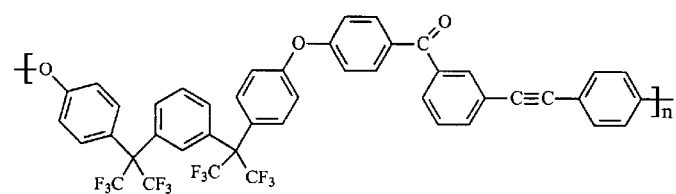
Figure 12D:
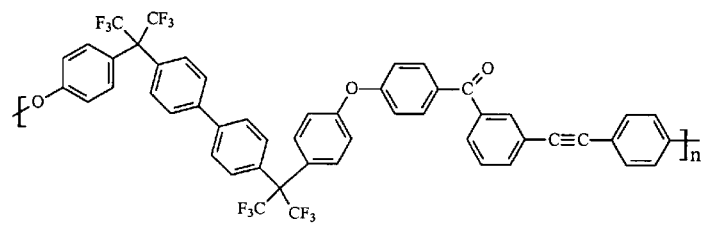
Figure 12E:
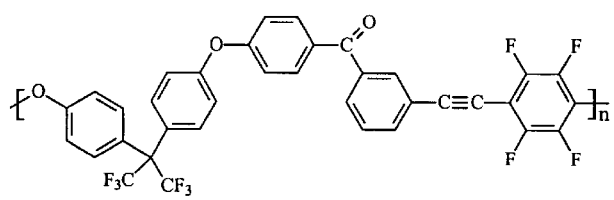
Figure 12F:
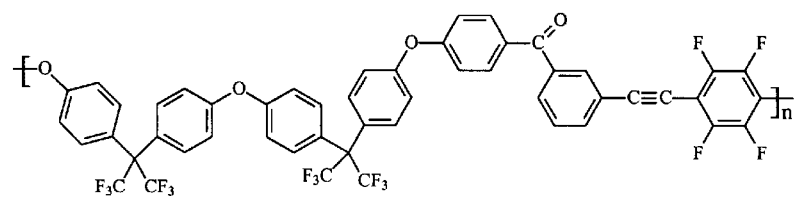
Figure 12G:
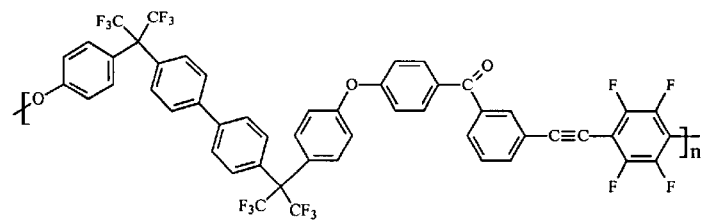
Figure 12H:
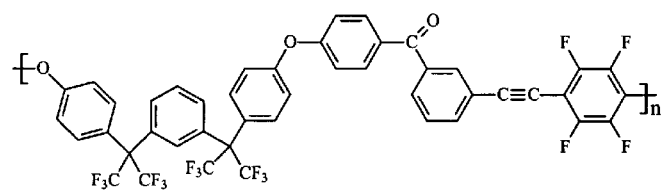
Figure 12I:
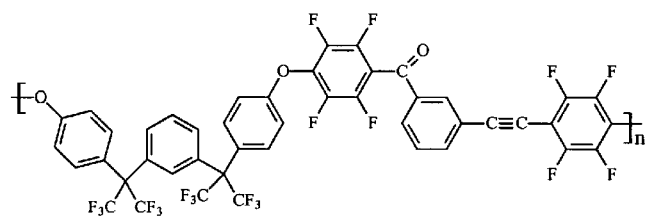

In FIGS. 10 and 11 contemplated crosslinkable units and thermally labilizable units are combined into single polymeric strands. After the polymer from each of these difluoroaromatics is synthesized, the thermally labile unit mentioned above can be grafted onto the polymer. Alternatively, the polymerization can be conducted with both the 4-fluorobenzoylphenyl-end-capped thermally labile unit and the difluoroaromatic monomer being allowed to react with fluorene bisphenol.

Example 6

In FIGS. 12A–12I, various structures of fluorinated repeating portions in a polymeric strand are shown. The introduction of fluorine into the polymeric strands is especially advantageous, because the dielectric constant of the dielectric material can be tailored according to the specific demands of a particular application. It should be appreciated that fluorine may directly be incorporated into the backbone by a covalent bond to an aromatic ring system to generate a fluoroaromatic polymeric strand. Alternatively, the fluorine may be added to the backbone in form of a —$CF_3$ group that may be attached to an aromatic or non-aromatic carbon atom. Fluorine is generally incorporated into the polymeric strands by employing fluorinated bisphenolic compounds and/or highly fluorinated aromatic compounds following the general protocol as depicted in FIG. 5.

Typical Synthesis for a Highly Fluorinated Aromatic Monomer

In standard equipment the following reactions were performed. In a first Heck reaction 1-Halo-3,4,5-trifluorobenzene (R=H, X=Br, I) reacts with ethynyltrimethylsilane under palladium catalysis in triethylamine solvent at 80° C. gave the intermediate 1-(trimethylsilylethynyl)-3,4,5-trifluorobenzene, which then undergoes the retro-Favorskii reaction in the presence of potassium carbonate in methanol to yield 1-ethynyl-3,4,5-trifluorobenzene. Similarly, 1-Halo-2,3,4,5,6-pentafluorobenzene (R=F, X=Br, I) reacts with ethynyltrimethylsilane under palladium catalysis in triethylamine solvent at 80° C. gave the intermediate 1-(trimethylsilylethynyl)-2,3,4,5,6-pentafluorobenzene, which then undergoes the retro-Favorskii reaction in the presence of potassium carbonate in methanol to yield 1-ethynyl-2,3,4,5,6-pentafluorobenzene.

From a second Heck reaction between 3-bromo-4'-fluorobenzophenone and 1-ethynyl-3,4,5-trifluorobenzene or 1-ethynyl-2,3,4,5,6-pentafluorobenzene, 3,4,5-trifluoro-3'-(4-fluorobenzoyl)tolane or 2,3,4,5,6-pentafluoro-3'-(4-fluorobenzoyl)tolane was synthesized, respectively.

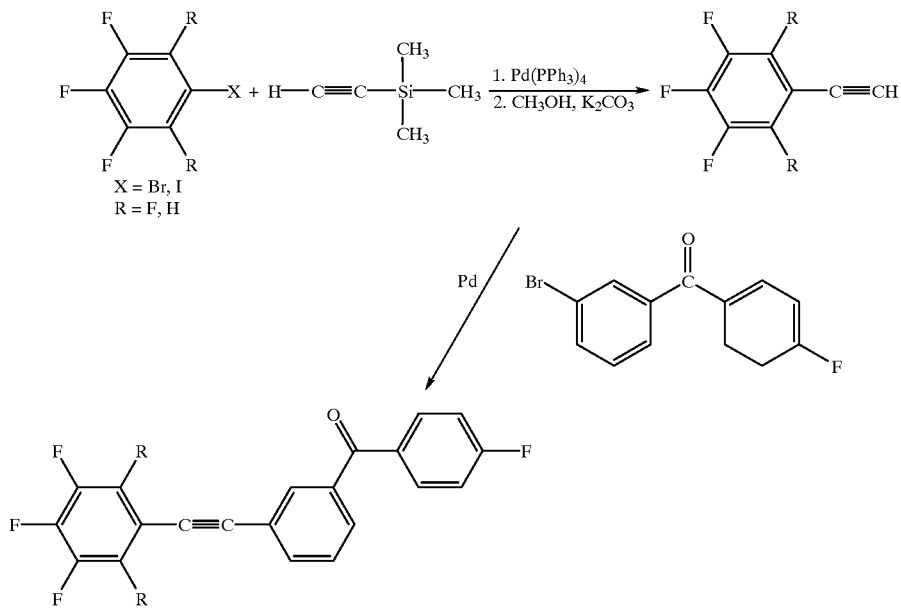

Alternatively, a set of two reactions similar to the Heck reaction as outlined could be performed between 3-bromo-2',3',4',5',6'-pentafluorobenzophenone and 1-ethynyl-3,4,5-trifluorobenzene or 1-ethynyl-2,3,4,5,6-pentafluorobenzene, leading to 3,4,5-trifluoro-3'-(2,3,4,5,6-pentafluorobenzoyl)tolane or 2,3,4,5,6-pentafluoro-3'-(2,3,4,5,6-pentafluorobenzoyl)tolane, respectively.

Thus, specific embodiments and applications of layered dielectric structures have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises", and "comprising", should be interpreted as referring to elements, components, or steps in a non-exclusive manner, indicating that the referenced elements, components, or steps may be present, or utilized, or combined with other elements, components, or steps that are not expressly referenced.

What is claimed is:

1. A method of producing a nanoporous material comprising:
   providing a plurality of polymeric strands wherein each of the polymeric strands includes a thermolabile portion, and defines a backbone including a plurality of reactive groups;
   providing a first energy to crosslink the polymeric strands using at least one of the reactive groups; and
   providing a second energy to at least partially degrade the thermolabile portion.

2. The method of claim 1 wherein all of the reactive groups are identical to one another.

3. The method of claim 1 wherein the backbone comprises a conjugated group.

4. The method of claim 1 wherein the backbone comprises an aromatic ring system.

5. The method of claim 1 wherein the backbone is fluorinated.

6. The method of claim 5 wherein at least one fluorine atom is covalently bound to an aromatic carbon atom.

7. The method of claim 5 wherein at least one fluorine atom is covalently bound to a non-aromatic carbon atom.

8. The method of claim 5 wherein at least one fluorine atom is covalently bound to a non-aromatic carbon atom, and at least one fluorine atom is covalently bound to an aromatic carbon atom.

9. The method of claim 1 wherein at least one of the reactive groups comprises a nucleophilic center.

10. The method of claim 1 wherein at least one of the reactive groups comprises an electrophilic center.

11. The method of claim 1 further comprising crosslinking of at least one of the polymeric strands with itself.

12. The method of claim 1 wherein crosslinking occurs without addition of an exogenous crosslinker.

13. The method of claim 1, wherein at least one of the polymeric strands crosslinks with at least another of the polymeric strands without generating a radical.

14. The method of claim 1 wherein at least one of the reactive groups comprises a diene.

15. The method of claim 1 wherein at least one of the reactive groups comprises a dienophile.

16. The method of claim 1 wherein the backbone comprises a ring system, and at least one of the reactive groups comprises a diene.

17. The method of claim 1 wherein the backbone comprises a ring system, and at least one of the reactive groups comprises a dienophile.

18. The method of claim 1 further comprising fabricating the backbone using a fluorene bisphenol and a difluoroaromatic compound, and wherein at least one of the reactive groups comprises a tetracyclone.

19. The method of claim 1 further comprising fabricating the backbone using a fluorene bisphenol and a difluoroaromatic compound, and wherein at least one of the reactive groups comprises an ethynyl function.

20. The method of claim 1 wherein the backbone is fabricated from a fluorinated fluorene bisphenolic compound and a fluorinated difluoroaromatic compound, and wherein the plurality of reactive groups comprise at least one tetracyclone and at least one ethynyl.

* * * * *

UNITED STATES PATENT AND TRADEMARK OFFICE
CERTIFICATE OF CORRECTION

PATENT NO. : 6,313,185 B1
DATED : November 6, 2001
INVENTOR(S) : Kreisler Lau et al.

It is certified that error appears in the above-identified patent and that said Letters Patent is hereby corrected as shown below:

Title page,
Item [22] Filed replace "Sep. 24, 1998" with -- March 30, 2000 --.

Signed and Sealed this

Twenty-eighth Day of May, 2002

*Attest:*

JAMES E. ROGAN
*Attesting Officer*     *Director of the United States Patent and Trademark Office*